United States Patent [19]

Shim et al.

[11] Patent Number: 5,296,394
[45] Date of Patent: Mar. 22, 1994

[54] MANUFACTURING METHOD OF GAAS METAL SEMICONDUCTOR FET

[75] Inventors: Kyuhwan Shim; Chulsoon Park; Dojin Kim; Sungjae Maeng; Jeonwook Yang; Youngkyu Choi; Jinyeong Kang; Kyungho Lee; Jinhee Lee, all of Daejeon, Rep. of Korea

[73] Assignee: Electronics and Telecommuniations Research Institute, Rep. of Korea

[21] Appl. No.: 812,615

[22] Filed: Dec. 26, 1991

[30] Foreign Application Priority Data

Dec. 26, 1990 [KR] Rep. of Korea ............... 90-21813
Dec. 26, 1990 [KR] Rep. of Korea ............... 90-21816

[51] Int. Cl.⁵ .................................. H01L 21/265
[52] U.S. Cl. ..................................... 437/39; 437/176; 437/184
[58] Field of Search .............. 437/39, 126, 184, 154, 437/22

[56] References Cited

U.S. PATENT DOCUMENTS

| 4,344,980 | 8/1982 | Yoder | 437/22 |
| 4,426,765 | 1/1984 | Shahriary et al. | 437/22 |
| 4,540,446 | 9/1985 | Nonaka et al. | 357/65 |

FOREIGN PATENT DOCUMENTS

| 0200059 | 12/1986 | European Pat. Off. | 437/176 |
| 0080129 | 7/1981 | Japan | 437/154 |
| 0115525 | 9/1981 | Japan | 437/154 |
| 0064925 | 4/1982 | Japan | 437/154 |
| 0175453 | 9/1985 | Japan | 437/154 |

Primary Examiner—Olik Chaudhuri
Assistant Examiner—Long Pham
Attorney, Agent, or Firm—Larson and Taylor

[57] ABSTRACT

A manufacturing method of GaAs metal semiconductor FET is disclosed. The method comprises the steps of: preparing a GaAs substrate; depositing a silicon layer on the GaAs substrate; forming a first photoresist pattern on the silicon layer by means of well-known image reversal process; etching the silicon layer by means of photolithographic process using the first photoresist pattern as a mask to define ohmic contact regions of source/drain electrodes; forming a second photoresist pattern on the GaAs substrate after removal of the first photoresist pattern to define a channel region; injecting a predetermined quantity of silicon ions into the GaAs substrate to form the channel region; depositing a protective layer around the GaAs substrate after removal of the second photoresist pattern; annealing the substrate deposited with the protective layer to activate silicon ions of the remaining silicon layer and thus diffusing the activating silicon ions into the depth direction of the substrate; forming ohmic contacts on the substrate using an ohmic contact mask after removal of the protective layer and the remaining silicon layer; and forming a gate electrode by using a gate mask.

3 Claims, 2 Drawing Sheets

MANUFACTURING METHOD OF GAAS METAL SEMICONDUCTOR FET

BACKGROUND OF THE INVENTION

1. Field of the Invention

The present invention relates to a manufacturing method of GaAs metal semiconductor FET (Field Effect Transistor).

2. Description of the Prior Art

Generally, in order to dope high-density ions of impurity into the source/drain regions of GaAs compound semiconductor devices, ion-implantation methods using high energy have been widely used in the art of the present invention.

However, when the above-mentioned ion-implantation method is applied to the fabrication of a GaAs metal semiconductor device, since lots of impurity ions are injected into the source/drain regions during the process, a problem arises in damaging of ohmic contacts of metal electrodes.

Also, when the ion-implantation method is applied to the fabrication of metal semiconductor devices using a self-aligned gate, ohmic contacts of metal electrodes get damaged due to lots of impurity ions. Thus doping density can not be raised to its maximum, and therefore electrical resistance of the ohmic contacts is raised.

Typical method for forming ohmic contact on GaAs substrate and implanting impurity ions therethrough is disclosed in U.S. Pat. No. 4,540,446.

SUMMARY OF THE INVENTION

It is therefore the object of the present invention to provide a manufacturing method of a GaAs metal semiconductor FET in which silicon ions of a silicon layer formed on a GaAs substrate are diffused by means of ion-implantation method using little energy and annealing treatment.

According to an aspect of the present invention, there is provided a manufacturing method of a GaAs metal semiconductor FET comprising the steps of: preparing a GaAs substrate; depositing a silicon layer on the GaAs substrate; forming a first photoresist pattern on the silicon layer by means of a well-known image reversal process; etching the silicon layer by means of a photolithographic process using the first photoresist pattern as a mask to define ohmic contact regions of source/drain electrodes; forming a second photoresist pattern on the GaAs substrate after removal of the first photoresist pattern to define a channel region; injecting a predetermined quantity of silicon ions into the GaAs substrate to form the channel region; depositing a protective layer around the GaAs substrate after removal of the second photoresist pattern; annealing the substrate deposited with the protective layer to activate silicon ions of the remaining silicon layer and thus diffusing the activating silicon ions into the deep direction of the substrate; forming ohmic contacts on the substrate using an ohmic contact mask after removal of the protective layer and the remaining silicon layer; and forming a gate electrode by using a gate mask.

In the manufacturing method, phosphorous ions or arsenic ions may be injected into the GaAs substrate before the injecting step of the silicon ions. Also, the protective layer may be formed with one of silicon-nitride, silicon-oxide, and silicon-oxide-nitride layers.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT(S)

Figure 1A:
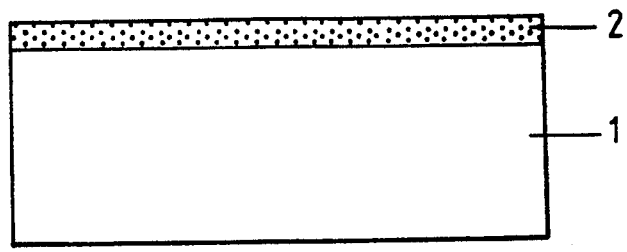
FIGS. 1A to 1G show process steps, in sectional-view, in accordance with a manufacturing method of a GaAs metal semiconductor FET of the present invention.

FIG. 1A shows that on a semi-insulating GaAs substrate (hereinafter, referred to as "GaAs substrate") 1 is formed a silicon layer 2 having 200 A in thickness.

Referring to FIG. 1A, a first photoresist layer 3 is deposited on the silicon layer 2 and patterned by means of an image reversal method, as well-known in this art, in order to define ohmic contact regions of source/drain electrodes. Then the silicon layer 2 is etched by means of a well-known photolithographic method. Then, using the first patterned photoresist 3 as a mask, only the silicon layer 2a just under a first patterned photoresist 3 remains on the GaAs substrate 1.

Figure 1B:
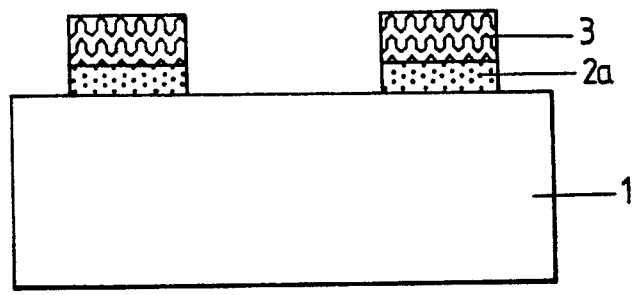

In the step for etching the silicon layer, a mask for the ohmic contact region in FIG. 1B is used as a mask for forming the first patterned photoresist. However, when an area of the remaining silicon layer 2a is larger than that defined by the ohmic contact mask, a mask may be used as a mask for the ohmic contact region in order that a distance from center point to a gate to be formed is still more closed. In this case, source resistance can be minimized without injecting impurity ions with high density into a substrate.

Figure 1C:
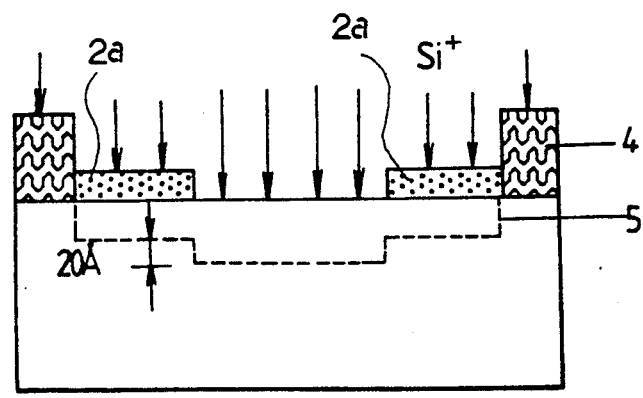
Figure 1:
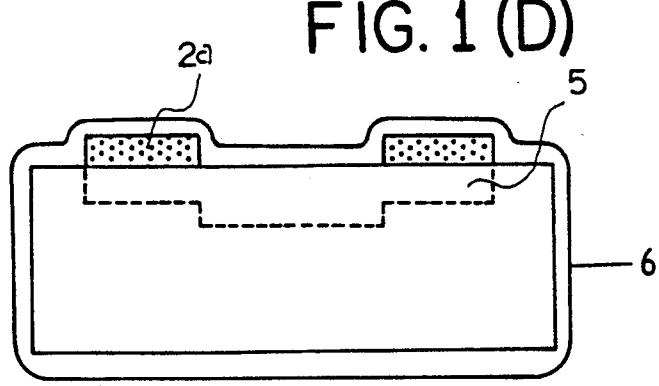
Figure 1:
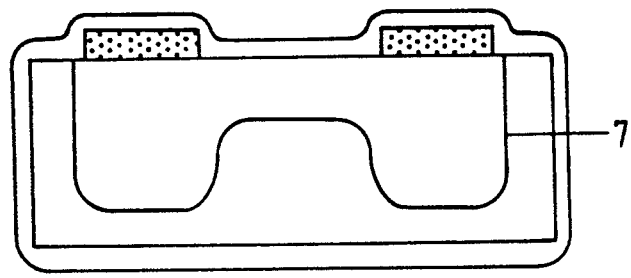
Figure 1:
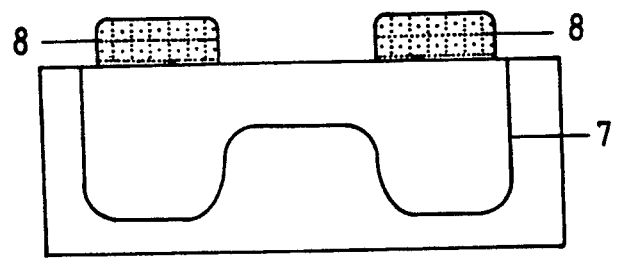
Figure 1:
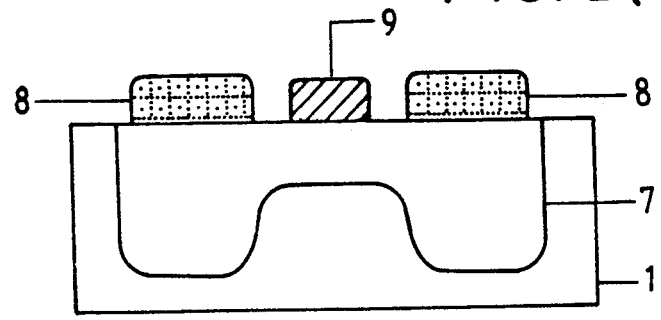

In FIG. 1C, after removal of the first patterned photoresist 3, a second photoresist layer 4 is deposited on the GaAs substrate 1 and the remaining silicon layer 2a and patterned by a channel ion-injecting mask to define a channel ion-injecting region 5. Subsequently, using a second patterned photoresist 4 as a mask, silicon ions are injected in the GaAs substrate 1 through the remaining silicon layer 2a and the surface of the substrate to form a channel region.

Here, the second patterned photoresist 4 completely intercepts the injection of the silicon ions into the substrate 1, but the remaining silicon layer 2a can not intercept all of the silicon ions being injected. Accordingly, the depth of the substrate 7 into which silicon ions are injected is dependent upon thickness of the remaining silicon layer. For example, the silicon layer having 100 A in thickness can intercept a ion-injecting depth of about 20 A in the substrate in accordance with an ratio of atomic weight of silicon to that of GaAs.

Also, phosphorous ions or arsenic ions may be injected into the substrate before injecting the silicon ions to replace gallium of the substrate with phosphorus or arsenic, and thus to reduce point defect generated by ion-injection and concentration of complex.

With reference to FIG. 1D, after removal of the second patterned photoresist 4, one of silicon-nitride, silicon-oxide, silicon-oxide-nitride layers is deposited as a protective layer 6 around the substrate 1 and the remaining silicon layer 2a by means of a plasma chemical vapor deposition, as well-known in the art. The protective layer 6 having 1500 A in thickness prevents arsenic injected in the substrate from escaping during annealing treatment.

In FIG. 1E, the ions injected in the channel region are electrically activated and further diffused in deep direction of the substrate by annealing treatment to form region of diffused silicon 7.

The annealing treatment is carried out under nitride circumstance, with argon deposition. Also, the other conditions of the annealing treatment are that the temperature is set to more than 800° C. and dependent upon material and thickness of the protective layer 6, and time for annealing is set to less than 30 minutes.

After removing the protective layer 6 and the remaining silicon layer 2a, ohmic contacts 8 are formed by using an ohmic contact mask, as shown in FIG. 1F. In detail, a third photoresist layer is deposited on the substrate 1 and patterned by the ohmic contact mask to define ohmic contacts of source/drain electrodes, and then one of AuGe, Ni, and Au materials is coated on the substrate 1 using the third patterned photoresist as a mask to form the ohmic contacts 8.

Finally, a gate 9 is formed on the substrate by means of a well-known lift-off method, using a gate mask, to form a metal semiconductor FET manufactured by the process steps.

As described above, in order to form ohmic contacts of source/drain electrodes, a silicon layer is deposited on a GaAs substrate at the position of the ohmic contacts to be formed. Using the silicon layer as a mask, little quantity of silicon ions generated by low energy are injected into the substrate to form a conducting channel. Subsequently, carrying out an annealing treatment, the injected silicon ions are electrically activated and diffused in the depth direction of the substrate to form highly doped ohmic contacts to solid solubility of the silicon ion.

Accordingly, the manufacturing method of the present invention can prevent damage to be generated in ohmic contacts of source/drain electrodes due to ion-injecting of high density. Also, since doping concentration can be raised to maximum solid solubility, electrical resistance of ohmic contacts can be improved.

In the invention, the GaAs metal semiconductor FET does not use a refractory metal gate, but can embody a metal with low resistivity such as titanium, platinum, or gold as a gate, so that the operating speed of the FET can be improved.

In addition, since the remaining silicon layer on the substrate can serve as align key during photolithographic process, it is easy to manufacture the GaAs metal semiconductor FET.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A manufacturing method of GaAs metal semiconductor FET comprising the steps of:
    preparing a GaAs substrate;
    depositing a silicon layer on the GaAs substrate;
    forming a first photoresist pattern on the silicon layer by an image reversal process;
    etching the silicon layer using the first photoresist pattern as a mask to define ohmic contact regions of source/drain electrodes;
    forming a second photoresist pattern on the GaAs substrate after removal of the first photoresist pattern to define a channel region; injecting a predetermined quantity of silicon ions into the GaAs substrate to form the channel region;
    depositing a protective layer around the GaAs substrate after removal of the second photoresist pattern;
    annealing the substrate deposited with the protective layer to activate silicon ions of the remaining silicon layer and thus diffusing the activating silicon ions into the deep direction of the substrate;
    forming ohmic contacts on the annealed substrate using an ohmic contact mask after removal of the protective layer and the remaining silicon layer; and
    forming a gate electrode by using a gate mask.

2. The manufacturing method of GaAs metal semiconductor FET according to claim 1, further comprising the step of injecting one of ions of phosphorus and arsenic into the GaAs substrate before the injecting step of the silicon ions.

3. The manufacturing method of GaAs metal semiconductor FET according to claim 1, wherein the protective layer comprises one of silicon-nitride, silicon-oxide, and silicon-oxide-nitride layers.

* * * * *